United States Patent
Lu et al.

(10) Patent No.: US 9,660,020 B2
(45) Date of Patent: May 23, 2017

(54) INTEGRATED CIRCUITS WITH LATERALLY DIFFUSED METAL OXIDE SEMICONDUCTOR STRUCTURES AND METHODS FOR FABRICATING THE SAME

(71) Applicant: GLOBALFOUNDRIES Singapore Pte. Ltd., Singapore (SG)

(72) Inventors: Yi Lu, Singapore (SG); Purakh Raj Verma, Singapore (SG); Dongli Wang, Singapore (SG); Deyan Chen, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 76 days.

(21) Appl. No.: 14/285,774

(22) Filed: May 23, 2014

(65) Prior Publication Data
US 2015/0340428 A1    Nov. 26, 2015

(51) Int. Cl.
*H01L 21/8238* (2006.01)
*H01L 29/06* (2006.01)
*H01L 29/78* (2006.01)
*H01L 29/10* (2006.01)
*H01L 29/66* (2006.01)
(Continued)

(52) U.S. Cl.
CPC ........ *H01L 29/063* (2013.01); *H01L 29/0623* (2013.01); *H01L 29/1095* (2013.01); *H01L 29/66659* (2013.01); *H01L 29/66689* (2013.01); *H01L 29/7816* (2013.01); *H01L 29/7835* (2013.01); *H01L 21/26513* (2013.01); *H01L 21/761* (2013.01); *H01L 29/0653* (2013.01)

(58) Field of Classification Search
CPC .......... H01L 29/7816; H01L 29/66681; H01L 29/063; H01L 29/0623; H01L 29/1095; H01L 29/66659; H01L 29/66689; H01L 29/7835; H01L 21/26513; H01L 21/761; H01L 29/0653
USPC ......................................... 438/204
See application file for complete search history.

(56) References Cited

U.S. PATENT DOCUMENTS 9,231,083 B2 *   1/2016   Yang ................ H01L 29/66689
2008/0246086 A1 * 10/2008   Korec ............... H01L 29/41741
                                                         257/343

(Continued)

*Primary Examiner* — Allen Parker
*Assistant Examiner* — Patricia Reddington
(74) *Attorney, Agent, or Firm* — Lorenz & Kopf, LLP

(57) ABSTRACT

Integrated circuits with improved laterally diffused metal oxide semiconductor (LDMOS) structures, and methods of fabricating the same, are provided. An exemplary LDMOS integrated circuit includes a p-type semiconductor substrate, an n-type epitaxial layer disposed over and in contact with the p-type semiconductor substrate, and a p-type implant layer disposed within the n-type epitaxial layer, wherein the p-type implant layer is not in contact with the p-type semiconductor substrate. It further includes an n-type reduced surface field region disposed over and in contact with the p-type implant layer, a p-type body well disposed on a lateral side of the p-type implant layer and the n-type reduced surface field region, and a shallow trench isolation (STI) structure disposed within the n-type reduced surface field region. Still further, it includes a gate structure disposed partially over the p-type body well, partially over the n-type surface field region, and partially over the STI structure.

9 Claims, 7 Drawing Sheets

(51) Int. Cl.
*H01L 21/265* (2006.01)
*H01L 21/761* (2006.01)

(56) References Cited

U.S. PATENT DOCUMENTS

| | | | |
|---|---|---|---|
| 2012/0043608 A1* | 2/2012 | Yang | H01L 29/0653 257/336 |
| 2014/0070315 A1* | 3/2014 | Levy | H01L 29/0634 257/343 |
| 2015/0270333 A1* | 9/2015 | Yang | H01L 29/063 257/337 |

* cited by examiner

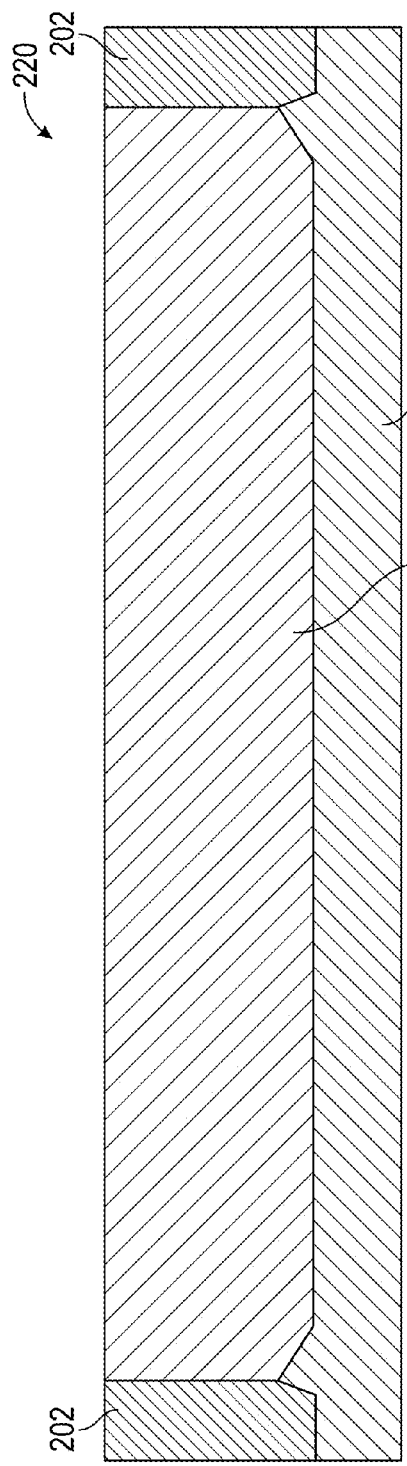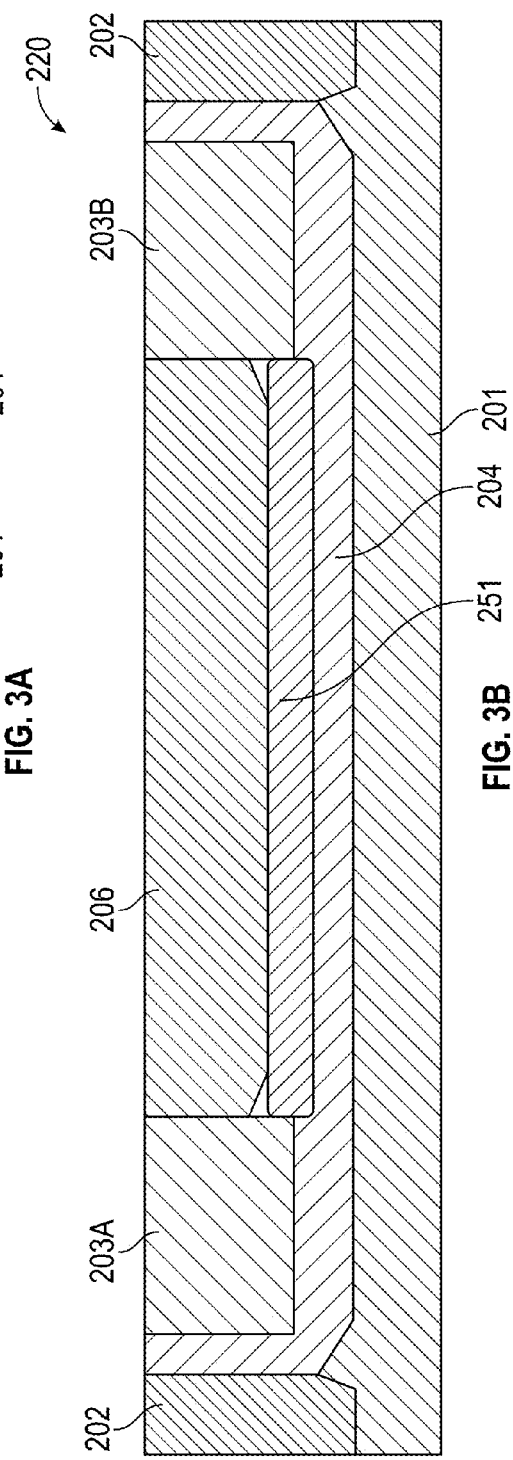

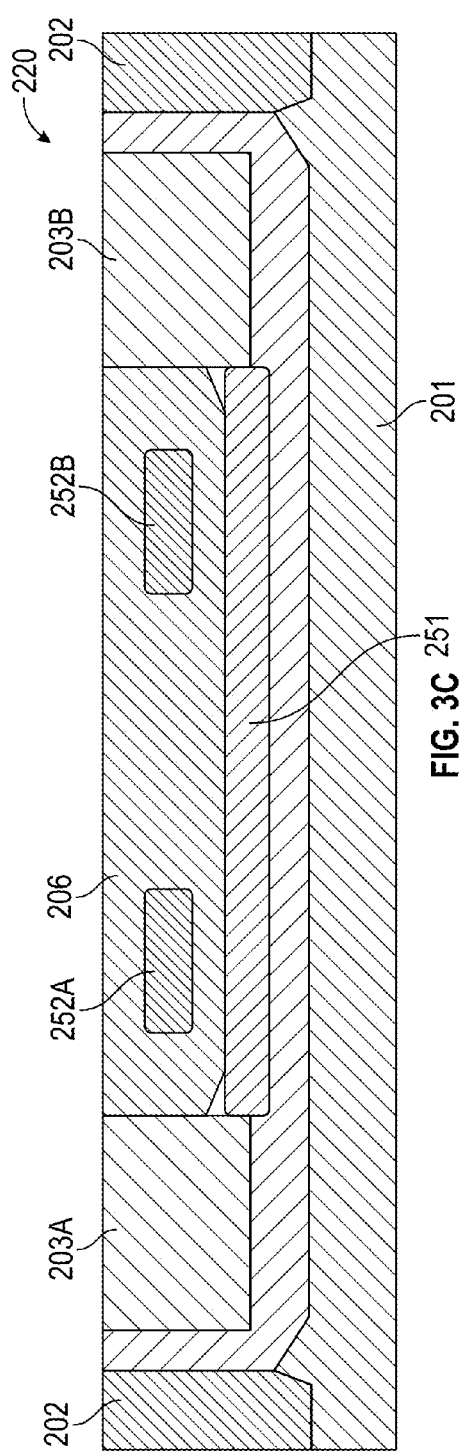
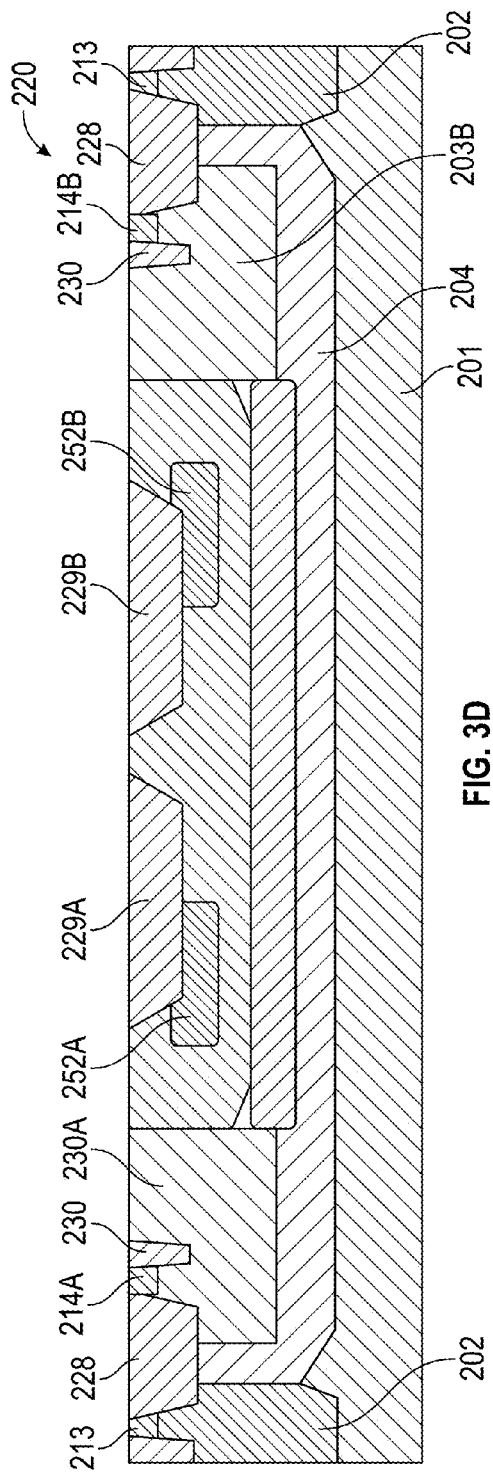
FIG. 3C
FIG. 3D

INTEGRATED CIRCUITS WITH LATERALLY DIFFUSED METAL OXIDE SEMICONDUCTOR STRUCTURES AND METHODS FOR FABRICATING THE SAME

TECHNICAL FIELD

The technical field generally relates to integrated circuits and methods for fabricating integrated circuits, and more particularly relates to laterally diffused metal oxide semiconductor (LDMOS) integrated circuit structures and methods for fabricating the same.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through an underlying channel between the source and drain regions.

Power MOS devices, including lateral diffused MOS (LDMOS) devices, are employed in a wide variety of applications, such as, for example, power amplifiers in wireless communications systems. LDMOS devices are generally characterized by the use of an epitaxial silicon layer on a more highly doped silicon substrate. While useful in many applications, LDMOS devices are not without drawbacks. For example, "hot carrier injection" (HCI) degradation can significantly limit the performance of these devices. As is well known in the art, the HCI phenomenon generally results from heating and subsequent injection of charge carriers into the gate oxide and/or an oxide layer above a drift region of an LDMOS device. This injection of charge carriers often results in a localized and non-uniform buildup of interface states and oxide charges near and underneath a gate and/or in the drift region of the device. For example, HCI can produce variations in certain characteristics of the LDMOS device, including saturation current, threshold voltage, transconductance, on-resistance, etc., thus undesirably affecting the performance and reliability of the device. The amount of HCI degradation in the device can be measured as a function of the amount of increase in the on-resistance of the device (on-resistance degradation) and/or the amount of decrease in the saturation current (saturation current degradation) in the device.

A conventional LDMOS device typically includes a lightly-doped drain (LDD) region which is often formed at or near an upper surface interface between the silicon and oxide of the device. Locating the LDD region in close relative proximity to the silicon/oxide interface, however, significantly increases the likelihood that charged carriers will become trapped at the interface, thereby increasing HCI degradation in the device.

In many applications, such as, for example, power amplifier applications, it is desirable to minimize the on-resistance associated with the device. In an LDMOS device, since the on-resistance is dominated primarily by the characteristics of the LDD region, one known methodology for reducing the on-resistance is to increase a doping concentration of the LDD region. However, since the LDD region is typically formed at the silicon/oxide interface of the device, as previously stated, increasing the doping concentration of the LDD region also undesirably increases HCI degradation in the device. The increase in HCI degradation resulting from the increased doping concentration of the LDD region often significantly undermines any beneficial reduction in on-resistance that may otherwise be achieved by increasing the doping concentration of the LDD region. Furthermore, by increasing the doping concentration of the LDD region in the device, the breakdown voltage of the device is undesirably reduced.

Accordingly, it is desirable to provide improved LDMOS devices capable of controlling HCI degradation that do not suffer from one or more of the problems exhibited by conventional LDMOS devices. Moreover, it is desirable to provide such improved LDMOS devices that are compatible with existing integrated circuit (IC) fabrication process technologies. In addition, it is desirable to provide methods for fabricating such LDMOS devices. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits with improved laterally diffused metal oxide semiconductor (LDMOS) structures, and methods for fabricating the same, are provided. In one embodiment, an exemplary LDMOS integrated circuit includes a p-type semiconductor substrate, an n-type epitaxial layer disposed over and in contact with the p-type semiconductor substrate, and a p-type implant layer disposed within the n-type epitaxial layer, wherein the p-type implant layer is not in contact with the p-type semiconductor substrate. The integrated circuit further includes an n-type reduced surface field region disposed over and in contact with the p-type implant layer, a p-type body well disposed on a lateral side of the p-type implant layer and the n-type reduced surface field region, and a shallow trench isolation structure disposed within the n-type reduced surface field region. Still further, the integrated circuit includes a gate structure disposed partially over the p-type body well, partially over the n-type surface field region, and partially over the shallow trench isolation structure.

In another exemplary embodiment, an LDMOS integrated circuit structure includes a p-type semiconductor substrate, an n-type epitaxial layer disposed over and in contact with the p-type semiconductor substrate, a p-type implant layer disposed within the n-type epitaxial layer, wherein the p-type implant layer is not in contact with the p-type semiconductor substrate. The integrated circuit further includes an n-type reduced surface field region disposed over and in contact with the p-type implant layer, first and second p-type body wells disposed on opposite lateral side of the p-type implant layer and the n-type reduced surface field region, and first and second shallow trench isolation structures disposed within the n-type reduced surface field region. Still further, the integrated circuit includes first and second gate structures. The first gate structure is disposed partially over the first p-type body well, partially over the n-type surface field region, and partially over the first shallow trench isolation structure. The second gate structure is disposed partially over the second p-type body well, partially over the n-type surface field region, and partially over the second shallow trench isolation region.

In yet another exemplary embodiment, a method for forming an LDMOS integrated circuit includes forming an n-type epitaxial layer over and in contact with a p-type semiconductor substrate, implanting p-type conductivity determining ions into the n-type epitaxial layer to form a p-type implant layer within the n-type epitaxial layer, wherein the p-type implant layer is implanted so as not to be in contact with the p-type semiconductor substrate, and implanting n-type conductivity determining ions into the n-type epitaxial layer and over the p-type implant layer to form an n-type reduced surface field region over and in contact with the p-type implant layer. The method further includes implanting p-type conductivity determining ions into the n-type epitaxial layer on lateral sides of the p-type implant layer and the n-type reduced surface field region to form a p-type body well disposed along the lateral sides of the p-type implant layer and the n-type reduced surface field region, forming a shallow trench isolation structure within the n-type reduced surface field region, and forming a gate structure partially over the p-type body well, partially over the n-type surface field region, and partially over the shallow trench isolation structure.

BRIEF DESCRIPTION OF THE DRAWINGS

The various embodiments will hereinafter be described in conjunction with the following drawing figures, wherein like numerals denote like elements, and wherein:

FIGS. 3A-3E are a cross-sectional views of LDMOS transistors and methods for fabricating LDMOS transistors in accordance with various embodiments of the present disclosure;

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Various embodiments of LDMOS integrated circuits, and method for fabricating the same, are described herein. The described embodiments utilize a p-type substrate with an n-type epitaxial layer grown thereon to form the LDMOS structure, in contrast with the conventional approach of using a p-type substrate with a p-type epitaxial layer grown thereon, as will be described in greater detail below. The described embodiments reduce the impact of the HCI phenomenon, thereby allowing the LDMOS integrated circuits to be operated at more desirable voltage and current levels. Further, the described embodiments reduce fabrications cost and complexities for LDMOS integrated circuits by requiring at least two fewer processing steps, as also will be described in greater detail below.

For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Figure 1:
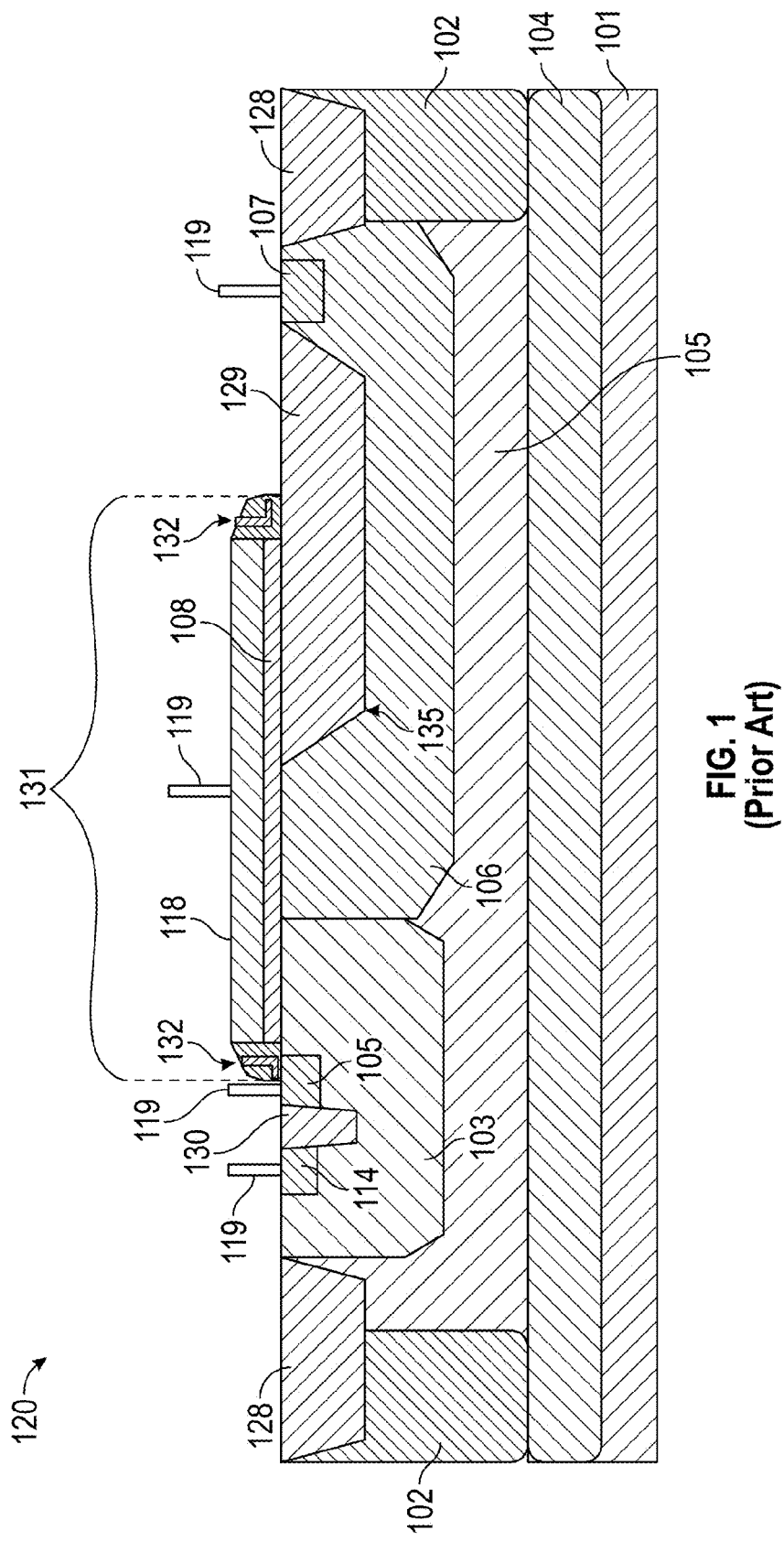
FIG. 1 is a cross-sectional view of a conventional LDMOS transistor of the prior art.

To more fully appreciate the benefits of the described embodiments, a brief description will be initially provided regarding conventional LDMOS integrated circuits. FIG. 1 is a cross-sectional view of a conventional LDMOS transistor 120, provided for purposes of comparison with the embodiments of the present disclosure. Conventional LDMOS transistor 120 includes a P− substrate 101 (as conventionally used in the art, the symbols "−" and "+" will be used to denote light doping and heavy doping, respectively, in connection with the specified "N" or "P"-type dopant) and an N+ buried layer 104 formed on the P− substrate 101. A P− epitaxial layer 105 is grown on N+ buried layer 104.

The active region of the LDMOS transistor 120 is defined between n-well regions 102 having shallow trench isolation (STI) structures 128 formed thereover. The active region of LDMOS transistor 120 is the region on P− epitaxial layer 105 where LDMOS transistor 120 is being fabricated or formed. The active region includes a P-well 103 in which an N+ source region 105 is formed. P-well 103 can be formed through ion implantation or diffusion of any p-type element such as boron. Similarly, the source region 105 can also be formed through ion implantation or diffusion of any n-type element such as arsenic.

The active region of the LDMOS transistor 120 also includes an n-type reduced surface field region 106 (which may also be formed using a suitable ion implantation process with an n-type ion) having a shallow trench isolation structure 129 formed thereover. STI structure 129 is formed within the action regions between STIs 128. Adjacent to STI structure 129 is an N+ drain region 107. Similar arsenic implantation can be used to form drain region 107 of LDMOS transistor 120.

Further, LDMOS transistor 120 includes a gate structure 131 that includes, for example, a polycrystalline silicon ("polysilicon") gate electrode 118 that is partially over n-type reduced surface field region 106 (including partially over STI structure 129) and partially over P-well 103. As shown in FIG. 1, gate structure 131 is isolated from n-type reduced surface field region 106 and P-well 103 by a thin dielectric layer 108, which can be, for example, a thin silicon oxide ($SiO_2$) layer. Further, on the sidewalls of gate structure 131, spacers 132 are formed. These spacers are non-conductive in nature and can be formed by using dielectric material such as silicon oxide ($SiO_2$) or nitride. Contacts 119 may be formed to the source 105, the drain 107, and the gate electrode 118. A contact may also be formed to a P+ body contact area 114, which is located over the P-well 103 and separated from the source 105 by an STI structure 130.

In high voltage and power applications, it is desirable to minimize the on-resistance of LDMOS transistor 120, such that the switch area and power dissipation associated with this transistor 120 is minimized. In conventional LDMOS devices such as the one shown in FIG. 1, to obtain a low on-resistance, and accordingly a high breakdown voltage, it is known to use the described P− substrate as a starting substrate, followed by the formation of the N+ buried layer, as described above. The requirement of the N+ buried layer adds at least two steps to the fabrication process, namely a lithographic masking step and a deposition step, which increases the cost and the complexity of the fabrication of the LDMOS device.

Figure 2:
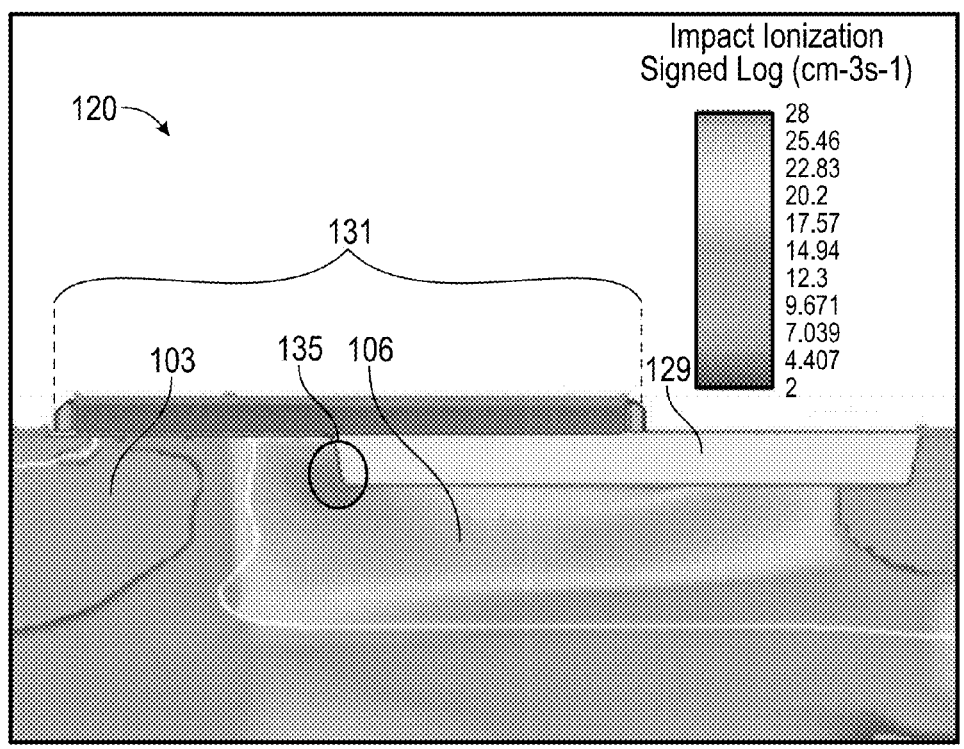
FIG. 2 is an illustration of the electric field generated during the operation of the conventional LDMOS transistor shown in FIG. 1.

In addition, in conventional LDMOS devices such as the one shown in FIG. 1, the sharp corners (reference numeral 135) typical of STI structure 129 locally increases the electric field at those corners, which results in rapid hot carrier degradation and lower breakdown voltage within LDMOS transistor 120. Current flowing through LDMOS transistor 120 is forced to bypass the STI structure 129, thereby resulting in a relatively high on-resistance. That is, the current flowing through LDMOS transistor 120 must flow deep within the silicon, along the relatively long path that exists under STI structure 129. FIG. 2 is illustrative of this current flow. As shown therein, a locally strong electric field exists at the sharp corner region 135 of STI structure 129. Further, the electric field is relatively strong underneath the STI structure 129 due to the deep flowing current in n-type region 106. This strong electric field, as noted above, causes the HCI phenomenon. The HCI phenomenon, in turn, causes the reduced device performance. That is, increasing gate voltage beyond a certain level, depending on design parameters, causes reduced substrate current flow, due to increasing resistance.

Figure 3E:
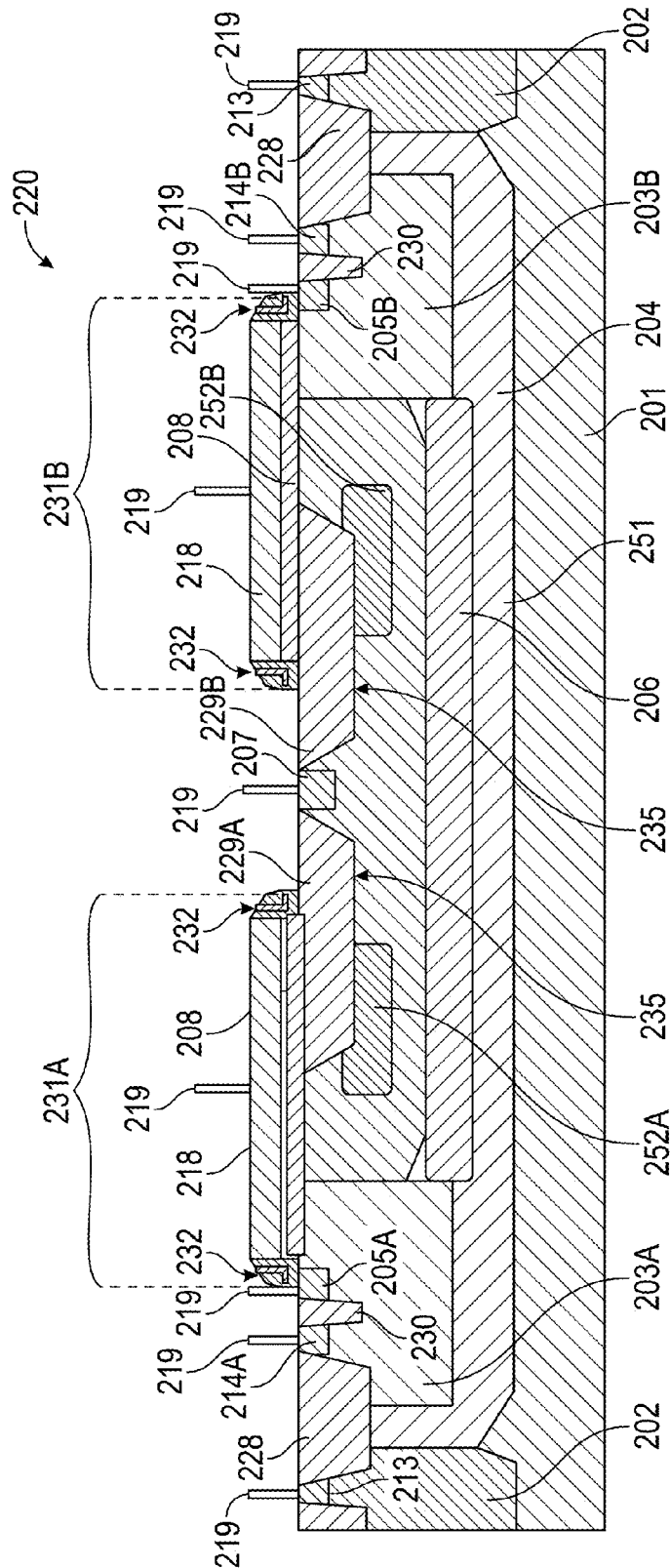

In order to address at least the foregoing deficiencies of the prior art, an illustrative embodiment of the present disclosure is provided in connection with FIGS. 3A-3E. FIGS. 3A-3E are a cross-sectional views of a transistor 220 in accordance with various embodiments, which includes P− substrate 201. With particular reference to FIG. 3A, LDMOS transistor 220 is fabricated using a p-type semiconductor substrate 201. P-type semiconductor substrate 201 can be, for example, a p-type monocrystalline silicon substrate. P-type semiconductor region 201 may alternately be an epitaxially grown p-type silicon layer or a p-type silicon-on-insulator (SOI) region. Upon P− substrate 201, an n-type epitaxial layer 204 is epitaxially grown. This differs from the prior art structure of FIG. 1 in that an N+ buried layer beneath a p-type epitaxial layer is not required. The active region of transistor 220 is defined by p-type isolation wells 202, which are provided within the n-type epitaxial layer 204, and STI structures 228 disposed over the p-type isolation wells (see FIGS. 3D and 3E). The epitaxial growth of n-type epitaxial layer 204 may be accomplished on the basis of any known method, including the use of gaseous or liquid precursors. For example, the n-type epitaxial layer 204 may be formed over p-type semiconductor substrate 201 by conventional CMOS processing steps for the epitaxial growth of doped semiconductor materials. P-type isolation wells may be formed on the basis of any well-known ion implantation technique.

Turning now to FIG. 3B, within the active region and into n-type epitaxial layer 204 is further provided a p-type implant layer 251 and a reduced surface field region 206. To form layers 251 and 206, a photolithographic masking layer may be patterned over the area wherein the layers 251 and 206 are to be formed, and then p-type and n-type conductivity determining ions may be implanted, respectively, using well-known ion implantation techniques. Separate photolithographic masking layers are not required for the formation of layers 251 and 206 because the p-type implant layer 251 may be formed using the same photolithographic mask that is used to form n-type reduced surface field region 206. In this regard, n-type reduced surface field region 206 is formed above the p-type implant layer 251. The p-type implant layer 251 is not in contact with the p-type semiconductor substrate 201. That is, it is not formed deep enough within the n-type epitaxial layer 204 to contact the p-type substrate 201.

P-type body wells 203A and 203B are also provided adjacent to p-type implant layer 251 and n-type reduced surface field region 206 on opposite lateral sides thereof. In this manner, p-type body well 203A, p-type implant layer 251, and p-type body well 203B form a continuous p-type area that extends around the lateral sides of, and beneath, n-type reduced surface field region 206. Suitable masking and implantation techniques may be used to form the body wells 203A and 203B. P-type layer 251, p-body wells 203A, and 203B, n-type reduced surface field region 206, and p-type implant regions 252A and 252 may be formed using conventional CMOS implantation procedures, which include: forming a lithographic implant mask, implanting an n- or p-type ion through an opening in the mask, and thermally diffusing the n- or p-type ion. As noted above, p-type layer 251 and n-type reduced surface field region 206 may be formed using the same lithographic mask.

With reference now to FIG. 3C, as initially noted, corner areas of the STI structures are susceptible to the HCI phenomenon. Accordingly, as shown in FIG. 3C, the transistor 220 includes p-type implant regions 252A and 252B. The p-type implant regions 252A and 252B are provided to "push" current flow away from corner regions, and thereby effectively prevent HCI degradation. In this regard, turning now to FIG. 3D, two STIs 229A and 229B are formed over and within the n-type reduced surface field region 206. Each STI 229A and 229B is associated with a respective gate structure 231A and 231B (FIG. 3E), as will be described in greater detail below. Accordingly, as shown in FIG. 3D, the transistor 220 includes p-type implant regions 252A and 252B in the corner areas 235 of STI structures 231A and 231B, respectively.

Turning now to FIG. 3E, the transistor 220 further includes first and second N+ source regions 205A and 205B, adjacent to gate structures 231A and 231B, respectively, within respective p-body wells 203A, 203B. A single N+ drain region 207 is formed within n-type reduced surface field region 206 between STIs 229A and 229B. Each source region 205A and 205B may be separated from P+ body contact regions 214A, 214B in? the respective p-body wells 203A, 203B. Additional p-type contact regions 213 may be formed within the p-type isolation regions 202 that define the active region. Contacts are provided to each of the p-type isolation contact regions 213, the body contact regions 214A, 214B, the source regions 205A, 205B, the drain region 207, and the gate electrodes 218. In the illustrated example, isolation regions 228-230 are formed using conventional CMOS processing steps, including lithographic masking and etching processes, followed by the deposition of a suitable non-conductive material (such as silicon oxide) in the resulting trenches. In alternate embodiments, isolation regions 228-230 can be formed by conventional LOCOS or poly-buffered LOCOS (PBLOCOS) processes.

Further, with reference to FIG. 3E, gate structure 231A is formed partially over p-body well 203A, partially over n-type reduced surface field region 206, and partially over STI structure 231A. Gate structure 231B is formed partially over p-body well 203B, partially over n-type reduced surface field region 206, and partially over STI structure 231B. Gate structures 231A and 231B include thin dielectric layers 208, gate electrodes 218, and sidewall spacers 232. In order to form the dielectric layers 208, a thermal oxide layer is formed over the semiconductor substrate. The thermal oxide dielectric layers 208 are formed using conventional oxidation deposition, well-known in the art. The layers 208 are appropriately patterned by: forming a photoresist mask, performing a dry etch, and then removing the photoresist mask. Thereafter, in order to form the gate electrodes 218, any gate-first process, replacement metal gate process, or gate-last process as is known in the art can be used.

Source/drain extension implants are performed to create lightly doped source/drain extension regions in LDMOS transistor 220. Dielectric sidewall spacers 232 are then formed adjacent to the gate electrodes 218. An N+ implant is performed to create source/drain contact regions 205A, 205B, and 207. A P+ implant is performed to create p-type body and p-type isolation region contact regions 214A, 214B, and 219. Metal salicide regions are formed over the resulting structure using a conventional salicide process. Contacts 219 are formed to the silicided regions to make electrical contact with the contact regions 205A, 205B, 207, 214A, 214B, and 219. Contacts 219 are formed within a (non-illustrated) inter-layer dielectric formed of an insulating material such as a silicon oxide. A standard CMOS process is used to form the remaining backend structures (e.g., metal lines and vias), which are not shown for the sake of clarity.

Figure 4A:
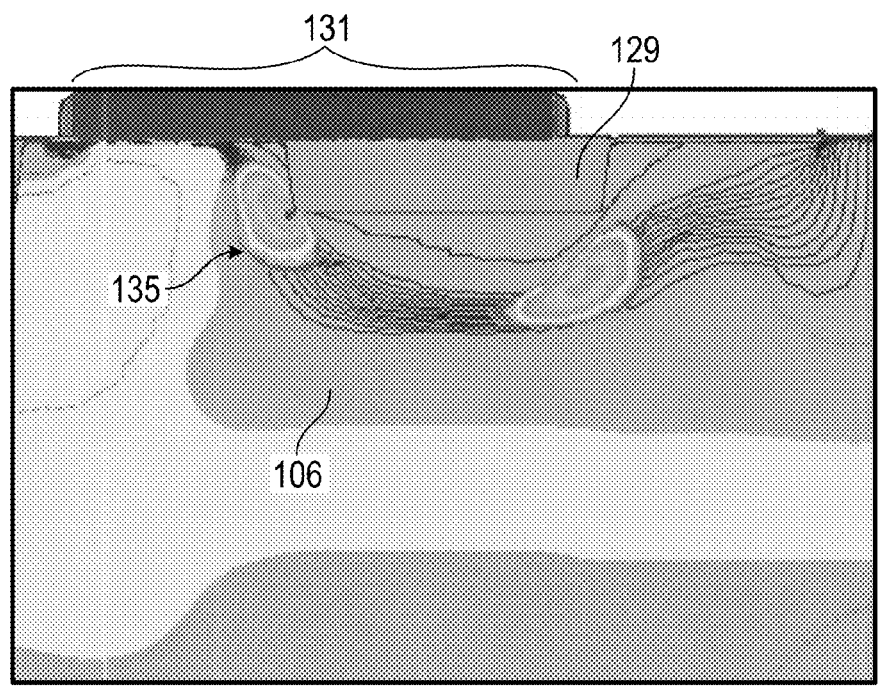
FIGS. 4A and 4B are illustrations of the electric field generated during the operation of both the conventional LDMOS transistor shown in FIG. 1 and the LDMOS transistor of the present disclosure shown in FIG. 3E, respectively.
Figure 4B:
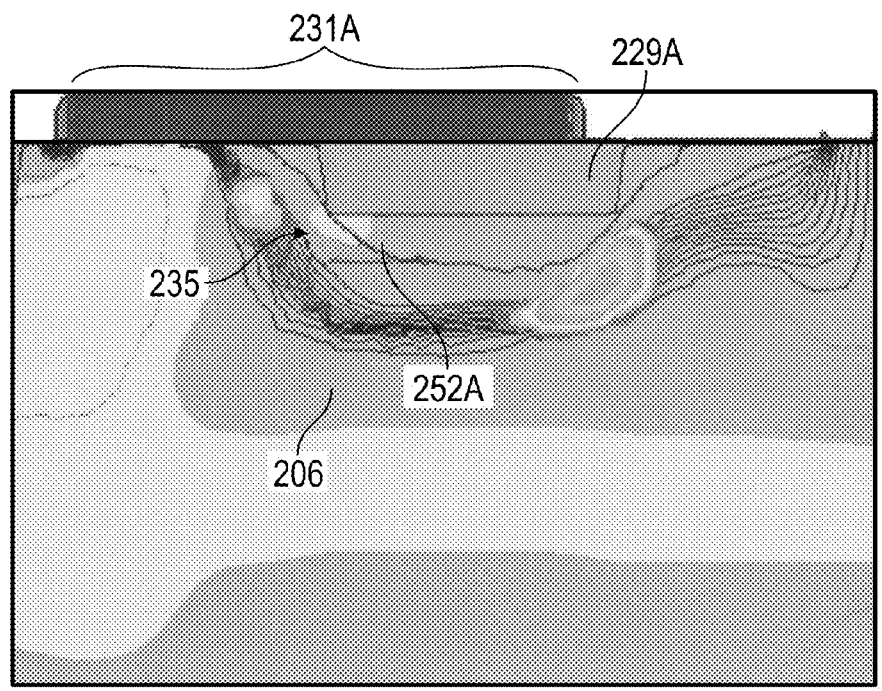

FIGS. 4A and 4B illustrate differences in impact ionization between an LDMOS device as shown in FIG. 1 (FIG. 4A) and an LDMOS device as shown in FIG. 3E (FIG. 4B). With the inclusion of the p-type implant 252A as shown in FIG. 4B, the current flow is "pushed" away from the corner region 235, thus reducing the impact ionization and reducing the HCI phenomenon.

Figure 5A:
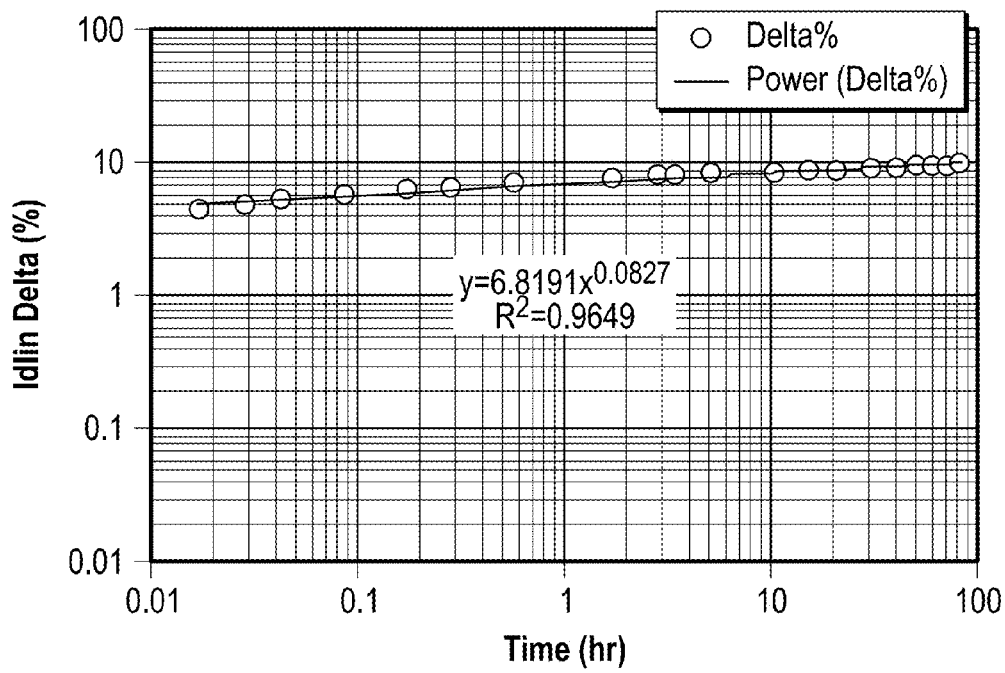
FIGS. 5A and 5B are graphs of the linear drain current produced by the conventional LDMOS transistor shown in FIG. 1 and the LDMOS transistor of the present disclosure shown in FIG. 3E, respectively.
Figure 5B:
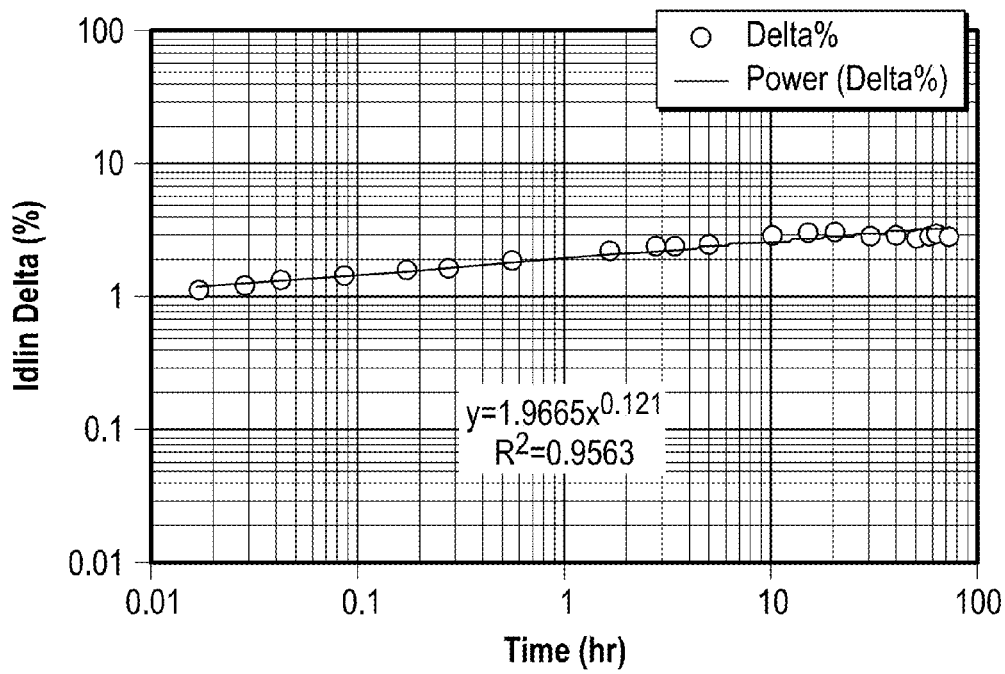

FIGS. 5A and 5B illustrate differences in linear drain current ($I_{dlin}$). As shown in FIG. 5B, the linear drain current observed during the operation of a device in accordance with the present disclosure is several times less than the linear drain current of the prior art. Reducing the linear drain current, as known in the art, allows for operation at higher powers in amplifier applications and the like.

Accordingly, improved LDMOS transistor structures have been described. The LDMOS transistors employ an n-type epitaxial layer over a p-type substrate to perform the same function as the conventionally used p-type substrate/ n-type buried layer/p-type epitaxial layer configuration known in the art, at a reduced expense and at a reduced fabrication complexity. Further, the LDMOS transistors employ p-type implants at corner regions of STI structures to "push" current flowing thereby away from the STI structures to reduce impact ionization, and thus reduce the aforementioned detrimental HCI phenomenon.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A laterally diffused metal oxide semiconductor (LDMOS) integrated circuit structure comprising:
   a p-type semiconductor substrate;
   an n-type epitaxial layer disposed over and in contact with the p-type semiconductor substrate;
   a p-type implant layer disposed within the n-type epitaxial layer, wherein the p-type implant layer is not in contact with the p-type semiconductor substrate;
   an n-type reduced surface field region disposed over and in contact with the p-type implant layer;
   first and second p-type body wells disposed on opposite lateral sides of the p-type implant layer and opposite lateral sides of the n-type reduced surface field region, wherein the first and second p-type body wells are separated and spaced apart from one another by the n-type reduced surface field region;
   first and second shallow trench isolation structures disposed within the n-type reduced surface field region; and
   first and second gate structures, wherein the first gate structure is disposed partially over and in physical contact with the first p-type body well, partially over and in physical contact with the n-type surface field region, and partially over and in physical contact with the first shallow trench isolation structure, and wherein the second gate structure is disposed partially over and in physical contact with the second p-type body well, partially over and in physical contact with the n-type surface field region, and partially over and in physical contact with the second shallow trench isolation region.

2. The LDMOS integrated circuit structure of claim 1, further comprising p-type implant regions disposed within the n-type reduced surface field region and adjacent to corner regions of the first and second shallow trench isolation structures, wherein the p-type implant regions do not contact with the p-type body wells or the p-type implant layer.

3. The LDMOS integrated circuit structure of claim 2, further comprising a first N+ source region disposed within the first p-type body well and a second N+ source region disposed within the second p-type body well.

4. The LDMOS of integrated circuit structure of claim 3, further comprising an N+ drain region disposed within the n-type reduced surface field region and between the first and second shallow trench isolation structures.

5. The LDMOS integrated circuit structure of claim 1, further comprising a first P+ body contact region disposed within the first p-type body well and a second P+ body contact region disposed within the second p-type body well.

6. The LDMOS integrated circuit structure of claim 1, further comprising first and second p-type isolation wells disposed on lateral sides of the n-type epitaxial layer.

7. The LDMOS integrated circuit structure of claim 6, further comprising a first P+ contact region disposed within the first p-type isolation well and a second P+ contact region disposed within the second p-type isolation well.

8. The LDMOS integrated circuit structure of claim 1, wherein the integrated circuit structure does not include an n-type buried layer.

9. The LDMOS integrated circuit structure of claim 1, wherein the integrated circuit structure does not include a p-type epitaxial layer.

* * * * *